United States Patent
Oman et al.

(10) Patent No.: US 9,114,720 B2
(45) Date of Patent: Aug. 25, 2015

(54) VEHICLE POSITIONING SYSTEM FOR WIRELESS CHARGING STATIONS

(71) Applicant: DELPHI TECHNOLOGIES, INC., Troy, MI (US)

(72) Inventors: Todd P. Oman, Greentown, IN (US); Kevin J. Hawes, Greentown, IN (US)

(73) Assignee: Delphi Technologies, Inc., Troy, MI (US)

( * ) Notice: Subject to any disclaimer, the term of this patent is extended or adjusted under 35 U.S.C. 154(b) by 174 days.

(21) Appl. No.: 13/939,531

(22) Filed: Jul. 11, 2013

(65) Prior Publication Data

US 2015/0015193 A1  Jan. 15, 2015

(51) Int. Cl.
*H02J 7/00* (2006.01)
*B60L 11/18* (2006.01)
*G01R 29/00* (2006.01)

(52) U.S. Cl.
CPC ........... *B60L 11/1829* (2013.01); *B60L 11/182* (2013.01); *B60L 11/1825* (2013.01); *G01R 29/00* (2013.01); *B60L 2230/16* (2013.01)

(58) Field of Classification Search
CPC ..... B06L 11/1829; H04J 7/025; H04B 5/037; H01F 38/14
USPC .......................................... 320/104, 107, 108
See application file for complete search history.

(56) References Cited

U.S. PATENT DOCUMENTS

| | | |
|---|---|---|
| 5,810,105 A | 9/1998 | Trainer |
| 8,319,605 B2 | 11/2012 | Hassan et al. |
| 8,373,581 B2 | 2/2013 | Hassan et al. |
| 2006/0083406 A1 | 4/2006 | Ishimura et al. |
| 2007/0110126 A1 | 5/2007 | Sekiguchi et al. |
| 2009/0123028 A1* | 5/2009 | Satonaka ................... 382/103 |
| 2010/0076622 A1 | 3/2010 | Dickerhoof et al. |
| 2010/0225527 A1 | 9/2010 | Talty et al. |
| 2010/0265035 A1 | 10/2010 | Ziller |
| 2011/0254503 A1 | 10/2011 | Widmer et al. |
| 2013/0015812 A1 | 1/2013 | Boyer et al. |
| 2014/0375261 A1* | 12/2014 | Manova-Elssibony et al. ............................ 320/108 |

FOREIGN PATENT DOCUMENTS

| | | |
|---|---|---|
| WO | 2005/088561 A3 | 9/2005 |
| WO | 2005/114593 A1 | 12/2005 |

OTHER PUBLICATIONS

Time Domain Announces Release of PulsON 410 OEM Module, Jun. 28, 2012, pp. 1-2.*
International Search Report PCT/US2014/039100, Sep. 3, 2014.

* cited by examiner

*Primary Examiner* — Vuthe Siek
(74) *Attorney, Agent, or Firm* — Lawrence D. Hazelton

(57) ABSTRACT

A system for positioning a vehicle over a wireless charging station. The system includes a plurality of ultra wideband transceivers (UWBX) installed on the vehicle and the wireless charging station, and a controller configured to determine various distances between the various UWBXs.

13 Claims, 5 Drawing Sheets

VEHICLE POSITIONING SYSTEM FOR WIRELESS CHARGING STATIONS

TECHNICAL FIELD OF INVENTION

This disclosure generally relates to wireless charging of electric or hybrid vehicles, and more particularly relates to using ultra wideband transceivers (UWBX) to assist with positioning a vehicle over a wireless charging station.

BACKGROUND OF INVENTION

Electric vehicles and electric-hybrid vehicles are gaining in popularity with consumers. The electric motors in these vehicles are typically powered from multiple storage batteries disposed in a battery pack in the vehicle. If the battery needs to be recharged while the vehicle is parked, a plug or leaded charge-coupling device is connected to the vehicle, typically by the vehicle operator. However, some operators object to having to 'plug-in' their vehicle each time the vehicle is parked.

Wireless or connector less battery chargers have been proposed, see U.S. Pat. No. 5,498,948 issued Mar. 12, 1996 to Bruni et al., and U.S. Pat. No. 8,008,888 issued Aug. 30, 2011 to Oyobe et al. A wireless battery charger marketed by Delphi of Troy, Mich. includes a source resonator or charging pad lying on a parking surface under the vehicle being charged, and a corresponding capture resonator or receiving plate mounted underneath the vehicle. The source resonator and capture resonator in this one example are about five hundred millimeters by five hundred millimeters square (500 mm×500 mm). Such wireless battery chargers are most efficient when the vehicle is parked such that the source resonator and the capture resonator are horizontally (i.e.—laterally and longitudinally) aligned. However, as the source resonator and the capture resonator are underneath the vehicle, it is difficult for the vehicle operator to judge where to park the vehicle so that the source resonator and the capture resonator are aligned.

SUMMARY OF THE INVENTION

Described herein is a vehicle positioning system that employs an Ultra Wideband (UWB) communication protocol. The UWB protocol is able to determine accurately a distance (e.g. +/−2 mm unobstructed) between a plurality of UWBXs either on a vehicle or a charging station, and sole UWBX on the other. A feature of the UWB communication protocol is that communication is by way of pulses or bursts of electromagnetic energy that spread the signal from a UWBX across a wider spectrum of frequency than is typically the case for communications protocols that transmit at a particular carrier frequency. The spreading of the signal across a wider band enhances the security of the transmission. UWB pulse or signals differ from widely used narrowband by their relatively large bandwidths. A common signaling scheme for UWB systems is known as impulse radio (IR) UWB, which consists of short duration pulses (on the order of a nanosecond) with low duty cycles, and employs different time-hopping and polarity codes. UWB signals have some very important properties which make them good candidates for many applications. First, due to their large absolute bandwidths, UWB systems can employ very short duration waveforms, and hence, they can achieve high time resolution and facilitate accurate range and position estimation. Large bandwidths of UWB signals also enable high-speed data transmission. In addition, since UWB signals can cover a large portion of the frequency spectrum, including low as well as high frequencies (i.e., they can have large relative bandwidths), they achieve high penetration capability through obstacles. Furthermore, UWB systems can be operated in baseband in a carrier-free manner, which makes it possible to design low-cost and low-power systems. Also, UWB systems have greater immunity to multi-path errors common in typical narrow band systems. Due to their high time resolution, UWB signals can be employed in applications that require high positioning accuracy.

In accordance with one embodiment, a system for positioning a vehicle over a wireless charging station is provided. The system includes a wireless charging station equipped with a base wideband transceiver (UWBX); a first UWBX configured to be installed on a vehicle; a second UWBX configured to be installed on the vehicle; and a controller. The controller is configured to determine a location of the wireless charging station relative to the vehicle based on a first distance between the base UWBX and the first UWBX, and a second distance between the base UWBX and the second UWBX.

In another embodiment, a system for positioning a vehicle over a wireless charging station is provided. The system includes a wireless charging station equipped with a plurality of wideband transceivers (UWBX); a vehicle UWBX configured to be installed on a vehicle; and a controller. The controller is configured to determine a location of the wireless charging station relative to the vehicle based on distances between the plurality of UWBXs and the vehicle UWBX.

In yet another embodiment, a system for positioning a vehicle over a wireless charging station is provided. The system includes a wireless charging station equipped with a base wideband transceiver (UWBX), and a vehicle UWBX configured to be installed on a vehicle. The system also includes a multiplexer configured to couple a plurality of antenna to one of the base UWBX and the vehicle UWBX. The one of the base UWBX and the vehicle UWBX that is not coupled to the plurality of antenna is designated a sole UWBX. The controller is configured to determine a location of the wireless charging station relative to the vehicle based on distances between the plurality of antenna and the sole UWBX.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example with reference to the accompanying drawings, in which.

DETAILED DESCRIPTION

Figure 1:
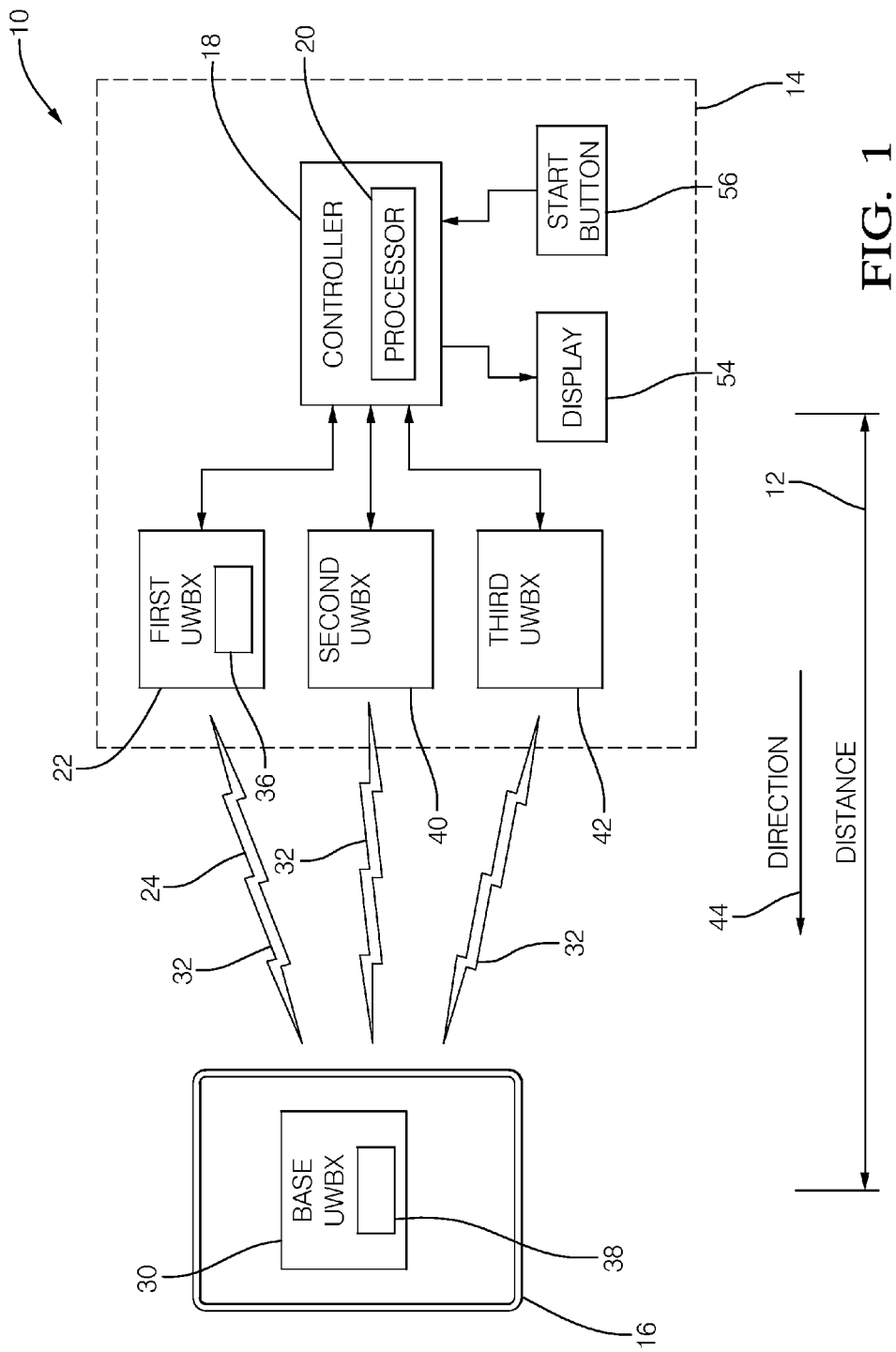
FIG. 1 is a diagram of a system for positioning a vehicle over a wireless charging station in accordance with one embodiment.

FIG. 1 illustrates a non-limiting example of a system 10 for positioning a vehicle 14 over a wireless charging station 16.

As will become apparent in the description that follows, the system 10 is generally configured to determine a distance 12 and/or a direction 44 (i.e. relative distance and/or relative direction) between the vehicle 14 and the wireless charging station 16. Other alternative configurations or embodiments of the system 10 are presented following the description of the example shown in FIG. 1. the vehicle 14 may be an automobile, truck, utility vehicle, or any type of vehicle that relies on batteries all or in-part for propulsion. The wireless charging station 16 may be comparable to what is shown in U.S. Pat. No. 8,008,888 issued Aug. 30, 2011 to Oyobe et al.

In this example, the wireless charging station 16 is equipped with a base wideband transceiver (UWBX) 30, and the vehicle 14 is equipped with a first UWBX 22 and a second UWBX 40. In general, the first UWBX 22 and the second UWBX 40 are configured to be installed on the vehicle 14, for example in or near the headlights of the vehicle as suggested in FIG. 2. Alternatively, the first UWBX 22 and the second UWBX 40 may be installed under the vehicle so as to be more directly exposed to the wireless charging station 16. In another alternative described in more detail below, the locations designated as the first UWBX 22 and the second UWBX 40 may be locations for antennas that are coupled to the electronics portions of one or more UWBX's located at a more protected location on the vehicle 14. Also, as will be described in more detail, the vehicle 14 may be equipped with a single or sole UWBX coupled to a plurality of antenna by a multiplexer.

Referring again to FIG. 1, the system 10 generally includes a controller 18 configured to determine a location of the wireless charging station 16 relative to the vehicle 14 based on a first distance 12A between the base UWBX 30 and the first UWBX 22, and a second distance 12B between the base UWBX 30 and the second UWBX 40. If the controller 18 receives signals from only two UWBX's (e.g.—the first UWBX 22 and the second UWBX 40) the controller 18 may need to be provided with some additional information such as a gear selection or an indication that the vehicle 14 is moving forward or backward so that the controller can determine the direction 44. Alternatively, the system 10 may include a third UWBX 42 configured to be installed on the vehicle. Accordingly, the controller 18 may be further configured to determine the relative location of the vehicle 14 with respect to the wireless charging station 16 based on the first distance 12A, the second distance 12B, and a third distance 12C between the base UWBX 30 and the third UWBX 42. A suitable example of a UWBX is a PULSEON™ P410 available from Time Domain of Huntsville, Ala.

The controller 18 may include a processor 20 such as a microprocessor or other control circuitry as should be evident to those in the art. The controller 18 may include memory (not shown) including non-volatile memory, such as electrically erasable programmable read-only memory (EEPROM) for storing one or more routines, thresholds and captured data. The one or more routines may be executed by the processor 20 to perform steps for operating one or more ultra wideband transceivers (UWBXs) on the vehicle 14 to determine a distance (12, 12A, 12B, 12C) and/or direction 44 to the wireless charging station 16 based on signals output and received by the controller 18 from the one or more UWBXs as described herein.

Figure 2:
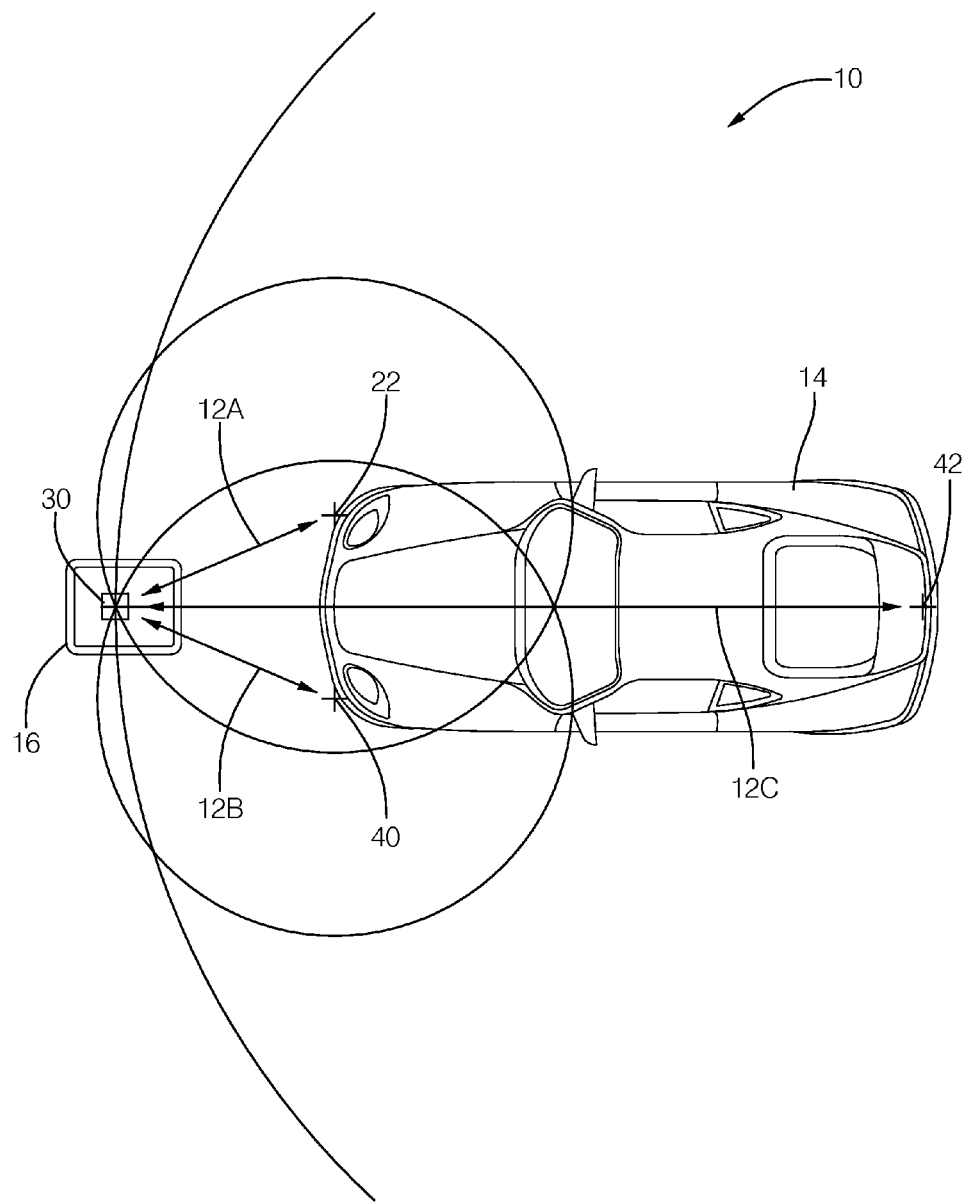
FIG. 2 is a top view of a vehicle being positioned by the system of FIG. 1 in accordance with one embodiment.

FIG. 2 illustrates a non-limiting example of the vehicle 14 equipped with the first UWBX 22, the second UWBX 40, the third UWBX 42 as the vehicle approaches the wireless charging station 16. As the vehicle 14 is equipped with three UWBXs, the controller 18 can determine the relative location (e.g. the distance 12 and the direction 44) of the vehicle 14 with respect to the wireless charging station 16 using triangulation or trilateration. With three UWBXs, the controller 18 does not need additional information such as gear selection or vehicle travel direction. A description of trilateration is found in EFFICIENT SOLUTION AND PERFORMANCE ANALYSIS OF 3-D POSITION ESTIMATION BY TRI-LATERATION by D. E. Manolakis, IEEE trans. on Aerospace & Electronic Systems, Vol. 32, No. 4, October 1996, pp 1239-1248.

In general, trilateration requires accurate base station distance reference measurements to accurately determine range and direction to a relatively distant object. These reference distances are generally based on mechanical dimensions of the system 10. For example, distances between antenna, length of wires connecting the antenna to the UWBXs, length of wires from the UWBXs to the controller 18, etc. The controller 18 may be configured to perform an auto-calibration process to determine these reference distances in order to compensate the system for installation variations that may influence values used in the trilateration calculations. The auto-calibration process may be improved two way measurements such as time-of-flight from the first UWBX 22 to the second UWBX 40, and time-of-flight from the second UWBX 40 to the first UWBX 22. Multiple measurements with averaging may also is used to improve the accuracy of the base station reference distance measurements. Auto-calibration is advantageous as it accounts for mechanical variation of the transponder antenna mounting, and variations in antenna cable length that cause delay and thus measured distance variation. The auto-calibration would typically be performed at system power-up and/or periodically during system operation.

Figure 3:
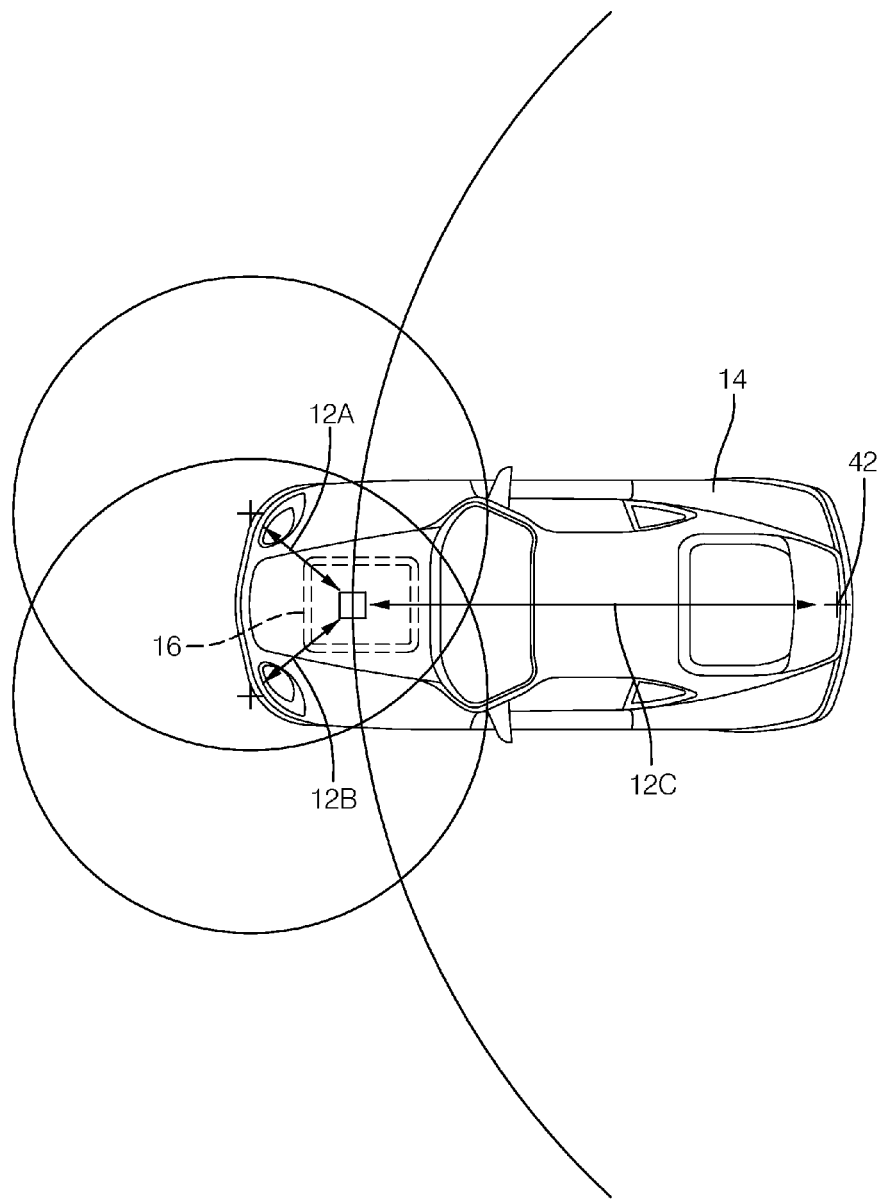
FIG. 3 is a top view of a vehicle being positioned by the system of FIG. 1 in accordance with one embodiment.

FIG. 3 illustrates an example of the distances 12A, 12B, and 12C when the vehicle 14 is properly positioned over the wireless charging station 16.

Referring again to FIG. 1, in general, the first UWBX 22 is electrically coupled to the controller 18 in a manner effective for the first UWBX 22 to be operated by the controller 18 and send signals to the controller 18. The electrical coupling may be by way of wires, fiber optics, or wireless connection, as will be recognized by those in the art. In particular, the controller 18 and the first UWBX 22 cooperate to transmit a request pulse 24. As used herein, the request pulse 24 is an electromagnetic signal emitted by the first UWBX 22 in accordance with UWB communication protocols. However, this does not exclude emissions of other pulses by other UWBXs on the vehicle 14. In general, the request time marks the beginning of a first time interval used to determine the distance 12 between the vehicle 14 and the wireless charging station 16.

The controller 18 is shown separated from the UWBXs 22, 40, 42 only for the purpose of illustration. It is recognized that, for example, the controller 18 and the first UWBX 22 may be integrated into a single housing (not shown). A single housing may be preferable to minimize signal propagation delays caused by having the controller 18 and the first UWBX 22 at separate locations on the vehicle 14.

The base UWBX 30 is preferably installed in the wireless charging station 16 and configured to transmit a reply pulse 32 in response to the request pulse 24. The base UWBX 30 may be the same make and model as the first UWBX 22, or it may be a specialized device particularly well suited for being installed in the wireless charging station 16. For example, the base UWBX 30 may be configured so that the physical orientation of the base UWBX 30 does not interfere with the ability to transmit the reply pulse 32.

The first UWBX 22 may also be configured to detect the reply pulse 32 emitted by the base UWBX 30, and communicate that detection to the controller 18. The controller 18 may be further configured to determine the distance 12A between the first UWBX 22 and the base UWBX 30 based on the first time interval (not shown) between the request time and a first time that corresponds to when the reply pulse 32 is received by the first UWBX 22. By determining the distance 12, the controller 18 can surmise if the wireless charging station 16 is close enough to the vehicle 14 for efficient charging. For example, the system 10 may not charge the vehicle batteries if the distance 12 is to great, i.e. greater than a distance threshold.

It should be recognized that using UWBXs to determine a time-of-flight (TOF) of the request pulse 24 and the reply pulse 32 allows for the distance 12 to be determined with greater accuracy than other transceiver systems that rely on signal strength to estimate distance. While not subscribing to any particular theory, estimating distance based on signal strength has limited accuracy because multipath, interposed objects, antenna orientation, clothing, and other factors influence signal strength in an unpredictable manner. In contrast, measuring TOF to determine the distance 12 is generally not influenced by these factors, and so the distance 12 can be determined with more accuracy by using UWBXs.

The request pulse 24 may include a vehicle identification 36 such as a vehicle identification number (VIN) or a serial number of the first UWBX 22. The vehicle identification 36 may be stored in the first UWBX 22, or communicated to the first UWBX 22 by the controller 18. Transmitting the vehicle identification 36 may be advantageous because the system 10 may only allow charging if a signal received by base UWBX 30 includes a proper vehicle identification, and so would not give away electrical power to an unauthorized vehicle, or unnecessarily clutter the airwaves by responding to a request pulse from some unknown source. By way of further example, if the vehicle identification is known by the wireless charging station, the owner of the vehicle 14 may be properly billed for charging the vehicle 14.

Similarly, the reply pulse 32 may include a charging device identification 38 such as a serial number of the base UWBX 30, a code entered into the base UWBX 30 via a smart phone via a wireless connection (e.g. BLUETOOTH®), or a code derived from the vehicle identification 36 using a secret algorithm. Transmitting the charging device identification 38 may be advantageous to improve the security of the system 10 by requiring the base UWBX 30 to be properly recognized by the controller 18. Alternatively, the reply pulse 32 may include the base device identification and the vehicle identification 36, where the vehicle identification 36 may either be stored in the mobile UWBX, or be the vehicle identification 36 received in the request pulse 24. As such, the reply pulse 32 may include a vehicle identification 36 from the request pulse 24.

If the system 10 is configured with three transceivers, for example the first UWBX 22, the second UWBX 40, and the third UWBX 42 located on the vehicle as shown, the system 10 can distinctly determine the direction 44 using the known technique of triangulation or trilateration. Accordingly, the controller 18 may be configured to further determine the direction 44 from the vehicle 14 to the wireless charging station 16 based on various time intervals between the request time that the request pulse 24 is transmitted, and times when the reply pulse 32 is received by the various UWBXs 22, 40, 42. Alternatively, the system 10 may be configured so each of the UWBXs on the vehicle 14 take turns transmitting the request pulse, and so the relationship between each of the signals received by the controller 18 would need to be considered to determine the distance 12 and the direction 44.

Once the distance 12 and/or the direction 44 are known, the system 10 or the controller 18 may be further configured to operate the vehicle 14 in a manner that increases the convenience of the vehicle 14 for the owner or operator of the vehicle 14. For example, the system 10 may include a display 54 viewable by the operator (not shown) of the vehicle such as a reconfigurable display on the dashboard (not shown) of the vehicle 14. The display 54 may, for example, display the distance 12 graphically or numerically so the operator knows how far to move the vehicle 14 to be over or aligned with the wireless charging station 16. The display 54 may also show the direction 44 graphically, or provide instruction as to how much the operator should rotate the steering wheel (not shown) of the vehicle 14 in order to get the vehicle centered on a preferred approach vector to the wireless charging station 16.

Alternatively, the controller 18 may be configured to interact with parking assist system or the like on the vehicle, and thereby operate a braking system (not shown) of the vehicle and/or a steering system (not shown) of the vehicle for semi-autonomous or fully-autonomous positioning of the vehicle 14 over the wireless charging station 16. Such semi-autonomous or fully-autonomous vehicle systems are known. The system 10 may initiate whatever steps the system 10 is configured to perform in response to pressing of a start button 56 by the operator.

In an alternative embodiment not shown, the configuration of the system 10 illustrated in FIG. 1 may alter to place the controller 18 in direct communication with the base UWBX so the distance 12 and direction 44 could be determined by this relocated controller operating the base UWBX 30 to communicate with and determine time-of-flight data for communications to the first UWBX 22, the second UWBX 40, the third UWBX 42. For this configuration, the display 54 may be mounted on a wall of a garage proximate to the wireless charging station so the operator can see an indication of the relative positioning of the vehicle 14 and the wireless charging station 16.

Figure 4:
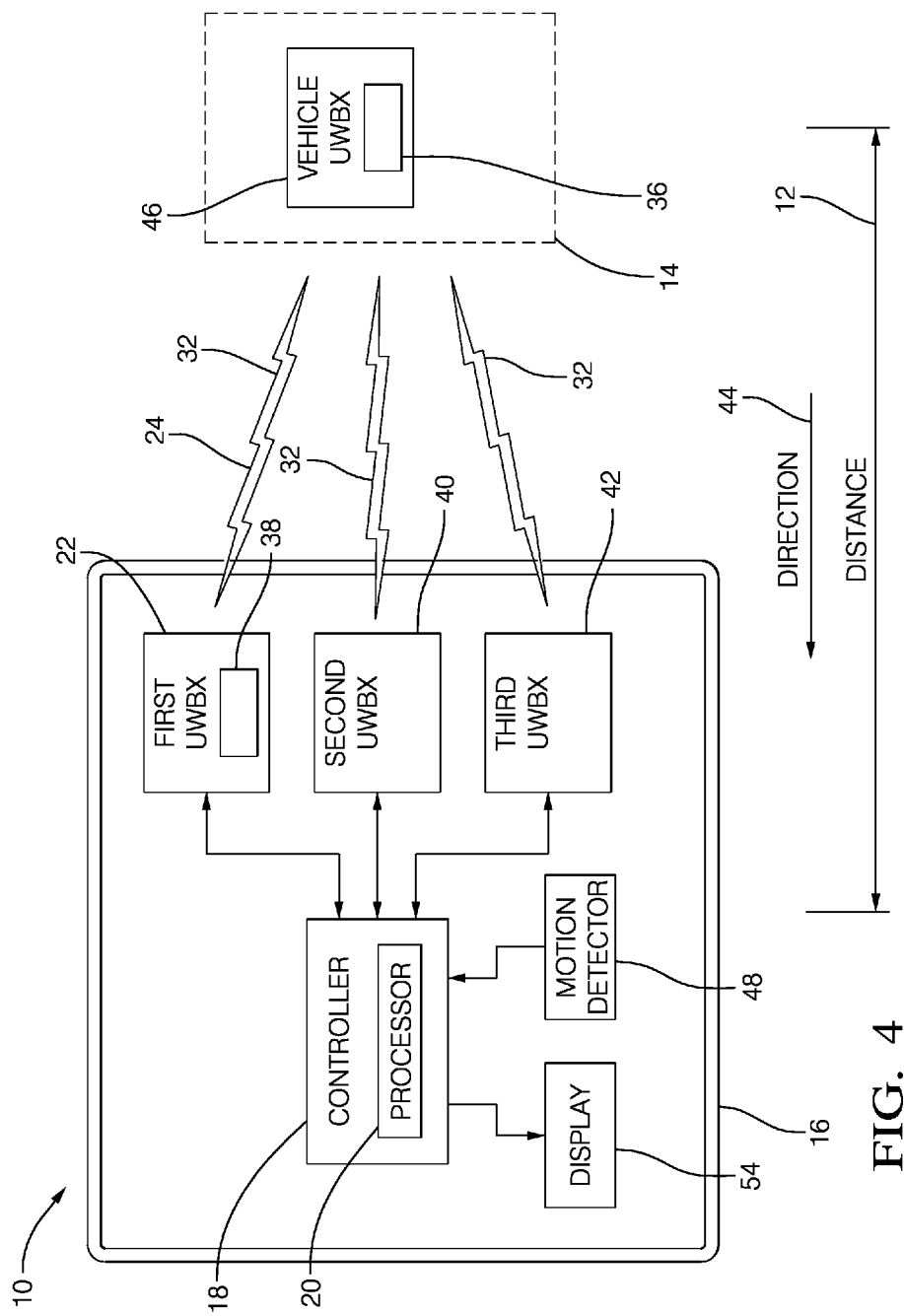
FIG. 4 is a system for positioning a vehicle over a wireless charging station in accordance with one embodiment.

FIG. 4 illustrates a non-limiting example of an alternative configuration of the system 10 for positioning the vehicle 14 over a wireless charging station 16. In this example, the wireless charging station 16 is equipped with a plurality of UWBXs, e.g. the first UWBX 22, the second UWBX 40, and the third UWBX 42, instead of in the vehicle as shown in FIG. 1. The vehicle 14 is equipped with one UWBX that is designated a vehicle UWBX 46. In this example the controller 18 and processor 20 are disposed in or proximate to the wireless charging station 16. Accordingly, the controller 20 is configured to determine a location of the wireless charging station 16 relative to the vehicle 14 based on distances between the plurality of UWBXs (22, 40, 42) and the vehicle UWBX 46. The wireless charging station 16 may also include a display 54 positioned to be viewable by an operator of the vehicle as the vehicle 14 approaches the wireless charging station 16, and may include a motion detector 48 or other such device known to those in the art to detect that the vehicle 14 is approaching so the controller 18 can initiate communication between the various UWBXs as described above. This arrangement of the system 10 may be advantageous as the wireless charging station may be located in a more benign environment such as a vehicle garage, and so the reliability of the controller 18 and UWBXs 22, 40, and 42 may be increased.

Figure 5:
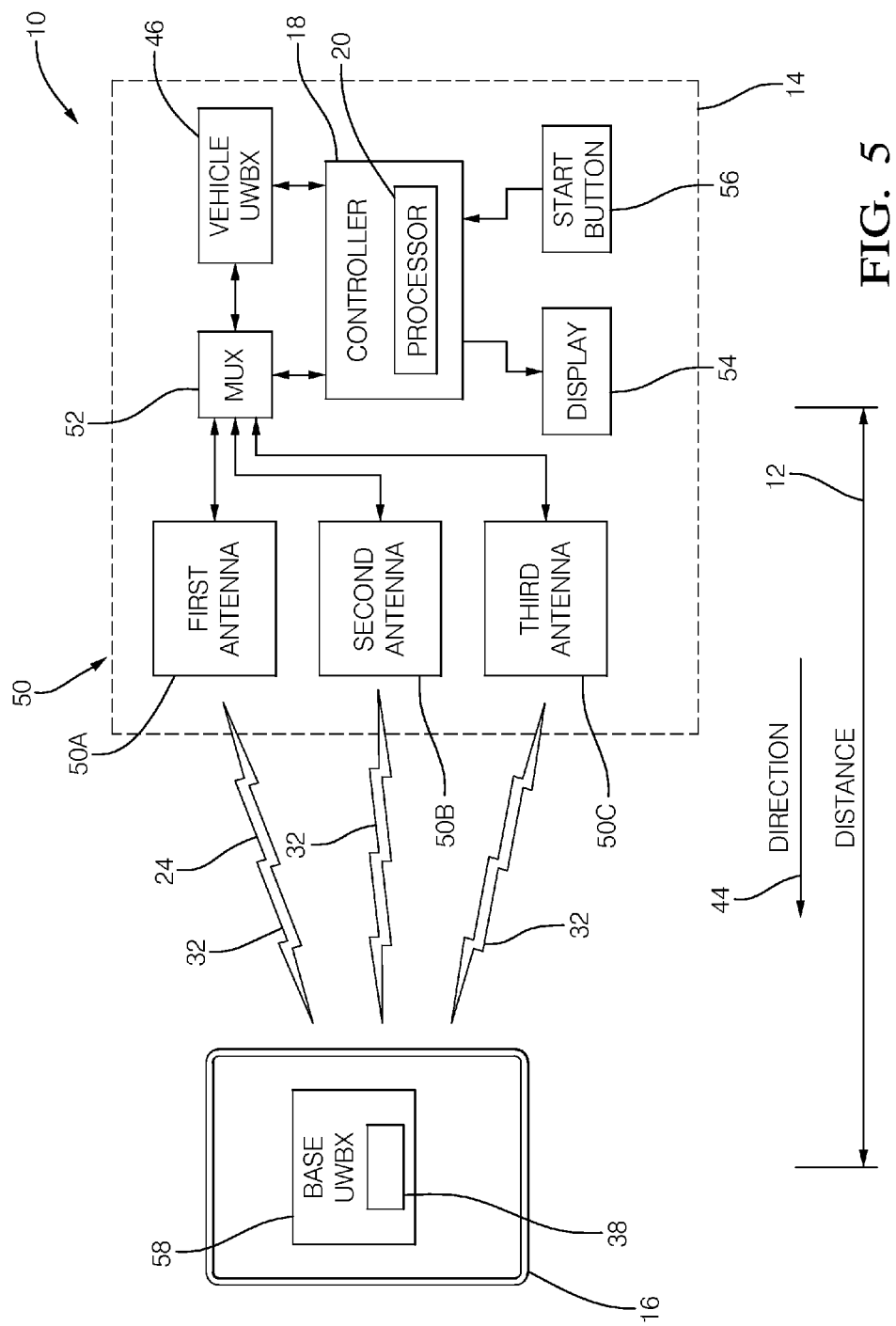
FIG. 5 is a system for positioning a vehicle over a wireless charging station in accordance with one embodiment.

FIG. 5 illustrates a non-limiting example of an alternative configuration of the system 10 for positioning the vehicle 14 over a wireless charging station 16. In this example, the wireless charging station equipped with one UWBX designated the base UWBX 30; and the vehicle 14 is equipped with one UWBX designated the vehicle UWBX 46 that is generally configured to be installed on a vehicle 14. In order to determine the distance 12 and/or the direction 44, the system 10 may include a plurality of antenna 50 (e.g. first antenna 50A, second antenna 50B, third antenna 50C) coupled to either the base UWBX 30 or the vehicle UWBX by a multiplexer 52. In this example, the vehicle 14 is equipped with the plurality of antenna 50, and so the multiplexer 52 is configured to couple a plurality of antenna 50 the vehicle UWBX 46. Alternatively, the plurality of antenna 50, multiplexer 52, controller 18 and other relevant parts could be installed I the wireless charging station 16 similar to the difference between FIG. 1 and FIG. 4. Whichever UWBX is not coupled to the plurality of antenna 50 is designated a sole UWBX 58. It follows that the controller 18 is configured to determine a location of the wireless charging station 16 relative to the vehicle 14 based on distances 12 between the plurality of antenna 50 and the sole UWBX 58. Using the multiplexer 52 may reduce the overall cost of the system 10.

Accordingly, a system 10 is provided for positioning a vehicle 14 over a wireless charging station 16. Using the time-of-flight (TOF) determining capabilities associated with ultra wideband transceivers (UWBXs) or devices to determine distance instead of signal strength improves positioning accuracy. Furthermore, using UWBXs reduces weight and increase flexibility for component placement; and reduces the transmitter power requirements due to frequency and bandwidth associate with UWBXs, typically 0.05 to 10 mW for tens to hundreds of meters of range.

While this invention has been described in terms of the preferred embodiments thereof, it is not intended to be so limited, but rather only to the extent set forth in the claims that follow.

We claim:

1. A system for positioning a vehicle over a wireless charging station, said system comprising:
a wireless charging station equipped with a base wideband transceiver (UWBX);
a first UWBX configured to be installed on a vehicle;
a second UWBX configured to be installed on the vehicle; and
a controller configured to determine a location of the wireless charging station relative to the vehicle based on a first distance between the base UWBX and the first UWBX, and a second distance between the base UWBX and the second UWBX, wherein the controller is further configured determine reference distance between the first UWBX and the second UWBX as part of an auto-calibration process.

2. The system in accordance with claim 1, wherein the system further comprises a third UWBX configured to be installed on the vehicle, wherein the controller is further configured to determine the location based on the first distance, the second distance, and a third distance between the base UWBX and the third UWBX.

3. The system in accordance with claim 1, wherein the system further comprises a display configured to indicate a direction to move the vehicle in order to position the vehicle over the wireless charging station.

4. The system in accordance with claim 3, wherein the display is further configured to indicate a distance to move the vehicle in order to position the vehicle over the wireless charging station.

5. The system in accordance with claim 1, wherein the controller is further configured to operate at least one of a braking system of the vehicle and a steering system of the vehicle for semi-autonomous or fully-autonomous positioning of the vehicle over the wireless charging station.

6. A system for positioning a vehicle over a wireless charging station, said system comprising:
a wireless charging station equipped with a plurality of wideband transceivers (UWBX);
a vehicle UWBX configured to be installed on a vehicle; and
a controller configured to determine a location of the wireless charging station relative to the vehicle based on distances between the plurality of UWBXs and the vehicle UWBX, wherein the controller is further configured determine reference distance between the plurality of UWBXs as part of an auto-calibration process.

7. The system in accordance with claim 6, wherein the system further comprises a display configured to indicate a direction to move the vehicle in order to position the vehicle over the wireless charging station.

8. The system in accordance with claim 7, wherein the display is further configured to indicate a distance to move the vehicle in order to position the vehicle over the wireless charging station.

9. The system in accordance with claim 6, wherein the controller is further configured to operate at least one of a braking system of the vehicle and a steering system of the vehicle for semi-autonomous or fully-autonomous positioning of the vehicle over the wireless charging station.

10. A system for positioning a vehicle over a wireless charging station, said system comprising:
a wireless charging station equipped with a base wideband transceiver (UWBX);
a vehicle UWBX configured to be installed on a vehicle;
a multiplexer configured to couple a plurality of antenna to one of the base UWBX and the vehicle UWBX, wherein the one of the base UWBX and the vehicle UWBX not coupled to the plurality of antennas is designated a sole UWBX; and
a controller configured to determine a location of the wireless charging station relative to the vehicle based on distances between the plurality of antennas and the sole UWBX, wherein the controller is further configured determine reference distance between the plurality of antennas as part of an auto-calibration process.

11. The system in accordance with claim 10, wherein the system further comprises a display configured to indicate a direction to move the vehicle in order to position the vehicle over the wireless charging station.

12. The system in accordance with claim 11, wherein the display is further configured to indicate a distance to move the vehicle in order to position the vehicle over the wireless charging station.

13. The system in accordance with claim 10, wherein the controller is further configured to operate at least one of a braking system of the vehicle and a steering system of the vehicle for semi-autonomous or fully-autonomous positioning of the vehicle over the wireless charging station.

* * * * *